United States Patent [19]

Darnell et al.

[11] Patent Number: 4,480,989

[45] Date of Patent: Nov. 6, 1984

[54] METHOD OF COOLING A FLANGE AND COUPLING

[75] Inventors: Robert D. Darnell, Phoenix; Carl A. Goetz, Scottsdale; William M. Ingle, Phoenix, all of Ariz.

[73] Assignee: Motorola, Inc., Schaumburg, Ill.

[21] Appl. No.: 518,186

[22] Filed: Sep. 29, 1983

Related U.S. Application Data

[62] Division of Ser. No. 250,494, Apr. 2, 1981, Pat. No. 4,411,619.

[51] Int. Cl.[3] ........................ F27B 14/10; F27D 7/00; H01L 7/00

[52] U.S. Cl. ........................................ 432/1; 29/569 R

[58] Field of Search ........................ 432/1, 32, 65, 253, 432/262, 237; 219/405; 422/240; 65/DIG. 8; 29/569

[56] References Cited

U.S. PATENT DOCUMENTS

| | | | |
|---|---|---|---|
| 3,626,154 | 12/1971 | Reed | 219/405 |
| 3,772,134 | 11/1973 | Rau | 65/DIG. 8 |
| 3,927,697 | 12/1975 | Baumler et al. | 65/DIG. 8 |
| 4,055,219 | 10/1977 | Orlandi et al. | 432/253 |
| 4,318,889 | 3/1982 | Schiller | 422/240 |
| 4,397,897 | 8/1983 | Schulke | 422/240 |

OTHER PUBLICATIONS

Introduction to Ceramics, Second Edition, W. D. Kingery et al., John Wiley & Sons, N.Y., 1976, pp. 646–703.

Handbook of Electronic Materials IF1 Plenum Data Corporation, Plenum Publishing Corp., New York, 1971, vols. 1, 2 & 3.

*Primary Examiner*—John J. Camby

*Attorney, Agent, or Firm*—Robert M. Handy

[57] ABSTRACT

Reaction vessels, furnace tubes, heating and cooling enclosures frequently have parts such as access ports, inlet tubes, inspection windows, etc. made of thermally transparent materials such as plastic, glass, quartz, oxides, nitrides and sulfides. When these parts extend outside the hot zone, they can act as "light pipes" carrying appreciable amounts of thermal radiation which can damage thermally sensitive gaskets or other materials used to secure external couplings or end closure flanges to these parts. Thermal radiation induced gasket damage is a frequent cause of stuck flanges and couplings. This problem is avoided by inserting a thermal radiation scattering region in the thermally transparent material between the hot zone and the end closure or gaskets. The thermal radiation is scattered and dispersed, so that the end zones receive less radiation and remain cooler. Milky quartz is a suitable scattering material for use with quartz furnace tubes or bell jars.

6 Claims, 3 Drawing Figures

-PRIOR ART-

METHOD OF COOLING A FLANGE AND COUPLING

This is a division of application Ser. No. 250,494, filed on Apr. 2, 1981, now U.S. Pat. No. 4,411,619.

BACKGROUND OF THE INVENTION

This invention relates to improved heating or cooling enclosures or reaction vessels having transparent protrusions, and more particularly, to means and method for reducing the thermal radiation being carried along such protrusions.

Glass, quartz, fused alumina and other optically and thermally transparent materials are widely used as enclosures for heating or cooling of materials. A vitreous quartz diffusion tube or bell jar for the processing of semiconductor materials is a typical example. In this example, the semiconductor materials are heated within a quartz tube in a furnace, epitaxial reactor, or other deposition apparatus. A portion of the quartz tube usually extends outside of the hot zone and is typically terminated by a removable coupling or flange which permits access or observation. Rubber, Teflon, Viton, other elastomers and other thermally sensitive materials are frequently used as gaskets on these flanges. If excess thermal energy is transmitted to these materials from the hot zone of the furnace or reactor they are damaged and stick to the flanges and tubes. It then becomes extremely difficult to separate the flanges from the tube ends without damaging the tubes or flanges or both. This has been found to occur even though the flanges and the extensions of the quartz tube beyond the hot zone are cooled by conductive or convective means. While placing a radiation reflector in the interior of the quartz tube between the hot zone and the flange reduces the amount of radiant heat coupled directly to the flange, it has not served to eliminate the problem of damage to the gaskets.

It has been discovered that a significant amount of radiant energy is coupled to the gasket or attachment areas by means of thermal and optical radiation being carried inside the wall regions of the quartz tubes. The wall regions of the quartz tube act as a "light pipe" carrying thermal radiation from the hot zone to the gaskets or attachment areas of the closure means. High intensity thermal radiation can be carried by the quartz material even though the local temperature of the quartz itself is relatively low. By this means, a large amount of energy can be coupled from the hot zone to the material of the gaskets or attachment areas, independent of the convective or conductive cooling means being applied to the quartz tube or the end flange.

This "light pipe" effect can be easily demonstrated by placing a quartz tube or rod in a high temperature flame. The portion of the rod a short distance outside the flame is cool to the touch, but if one's hand is placed facing the end, the heat being transmitted (carried) along the rod can be readily felt. Thermal radiation burns can result. For the purposes of this disclosure a thermal radiation carrying member, media, or enclosure is one which exhibits this light pipe effect, that is, channeling or carrying thermal radiation by radiant propagation from a hot zone to other regions.

Thus, a need continues to exist for reducing the coupling of radiant energy from hot zones to exterior couplings or flanges of transparent reactor enclosures, this radiation being carried in the walls of the enclosure itself.

Accordingly, it is an object of this invention to provide an improved apparatus for protecting closure means of a radiation carrying member coupled to a hot zone, from the radiant thermal energy being carried by said member between said hot zone and said closure means.

It is a further object of this invention to provide an improved apparatus for protecting a closure flange of a high temperature semiconductor reaction chamber from radiation being piped in the walls of the chamber.

It is an additional object of this invention to provide an improved process for heating materials in an enclosure of which a wall portion channels the thermal radiation from a source region to a closure region, said closure region being susceptible to damage by said radiation.

It is a further object of this invention to provide an improved method for protecting a closure means of a thermal radiation carrying member from the radiation being carried by the material of said member.

It is an additional object of this invention to provide an improved method for heating semiconductor materials to high temperatures in an enclosure while maintaining a coupling or closure flange connected thereto at a lower temperature.

It is a further object of this invention to provide an improved method for cooling a coupling or closure means of a semiconductor materials processing enclosure.

SUMMARY OF THE INVENTION

The attainment of the foregoing and other objectives and advantages is achieved through the present invention wherein the radiation path in the walls of a radiation carrying member portion of a reaction chamber containing a radiation source (hot zone) is interrupted by placing a radiation scattering region in the material of the member portion serially disposed between the hot zone and the closure means. This radiation scattering region intercepts and disperses a portion of the radiant energy being carried in the walls of the member portion and thus prevents it from reaching the closure means. Elastomer gaskets or other temperature sensitive materials in the closure means are thereby substantially protected from this source of energy.

BRIEF DESCRIPTION OF THE DRAWINGS

A more complete understanding of the present invention can be obtained by considering the following detailed description in conjunction with the accompanying drawings in which.

DETAILED DESCRIPTION OF THE PREFERRED EMBODIMENT

Figure 1:
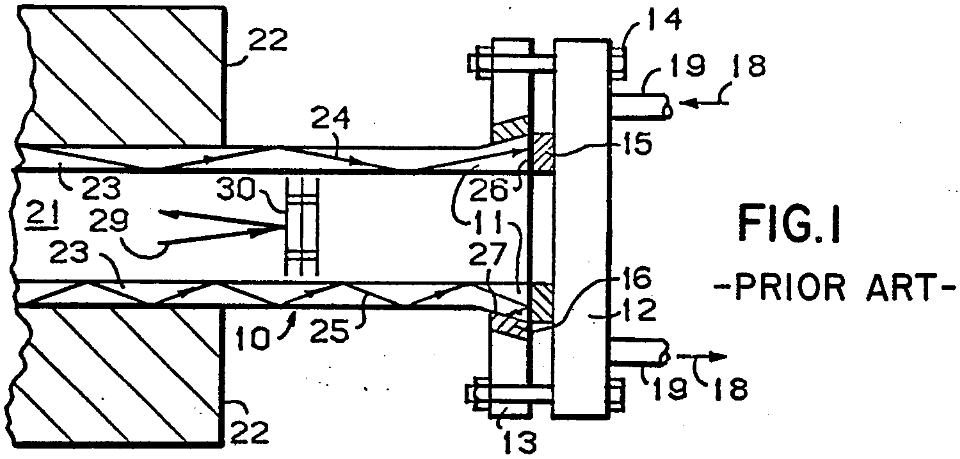
FIG. 1 illustrates a cross section of a prior art example of a quartz reaction tube extending from a hot zone of a furnace and having an external cooled closure flange.

It is useful to briefly discuss the mechanisms by which hot bodies give off energy and to define a number of the terms used in the present application.

A hot object or body radiates electromagnetic energy at all wavelengths. However, for most industrial processes the amount of energy being radiated at very short or very long wavelengths is relatively insignificant, and the majority of the energy is typically radiated in a band of wavelengths extending from the far infrared through the visible spectrum. The term "thermal radiation" as used herein refers to the electromagnetic radiation being given off by a hot object or media irrespective of whether that radiation is visible or invisible to the human eye. The wavelength regions of principal interest extend from the far infrared (1000 microns) to the ultraviolet (less than 0.4 micron). As the temperature of the hot body increases, the wavelength associated with the maximum radiant energy output decreases. Thermal radiation is an electromagnetic phenomena encompassing both "heat" and "light" and is physically distinct from ordinary thermal conduction or convection which proceeds by different mechanisms. As used herein, "high temperature", "hot", and "hot zone" are relative terms denoting a significant temperature difference and not necessarily a large absolute temperature.

Thermal radiation propagates in vacuum and in transparent media. A transparent media is one which passes, transmits or carries electromagnetic radiation of a given wavelength without significant scattering or absorption. Common examples of transparent media are plastic, glass, fused (vitreous) or crystalline quartz, oxides, nitrides, sulfides, and combinations thereof, but many others exist. Transparency need not be perfect.

Once thermal radiation has entered a transparent media, it can become trapped within the media because of the difference in dielectric constant of the media relative to the external ambient. Radiation rays within a relatively thin media are reflected back and forth from the interior surfaces so that the media acts as a "light pipe" or conduit channeling thermal radiation from one region or portion to another. Bends, angles, or directional changes in the material do not impede the light pipe effect when the radius of curvature of these directional changes is relatively large compared to the thickness of the material, so that the rays within the material can continue to make mostly low angle reflections from the internal surfaces.

Thus, thermal radiation entering the walls of a quartz vessel, for example, can be carried along within the walls to portions extending outside of the hot zone until the walls terminate or encounter an end means, coupling, closure means or flange. At this point, the propagating rays of thermal energy encounter an end or other surface with new materials of different dielectric constant or strike at a high angle or both, and exit without difficulty. If an elastomer or other temperature sensitive material is present against this end face or other surface, the thermal energy will be coupled directly to that material. The effective temperature of this radiant energy can be much higher than the actual local temperature of the container wall material (e.g. the quartz) through which it is being conducted. Thus, damage to temperature sensitive closure materials can easily result. As used herein, the words "end means", "closure means", or "coupling" or "flange" are intended to be synonomous and refer to any arrangement, mechanical or otherwise, whereby a thermal radiation carrying member is closed-off or connected to another body, media, or member.

FIG. 1 illustrates a prior art example of a quartz reaction tube 10 having an end region 11 to which is attached flange 12 and flange collar 13 by bolts 14 together with elastomer gasket 15–16. Quartz reaction tube 10 extends from hot zone 21 of furnace 22. Thermal radiation originating within hot zone 21 enters wall portion 23 of quartz tube 10. Thermal radiation rays 24–25 within wall portion 23 propagate from hot zone region 21 toward end region 11 where they intersect end surfaces 26–27 and are absorbed by elastomer gaskets or other thermally sensitive materials 15–16. Additional thermal radiation ray 29 originating within hot zone 21 and propagating down the interior of quartz reactor tube 10 is intercepted by radiation baffle 30. Cooling means 18–19 can be used to remove heat from flange 12 so as to cool one face of gasket 15. However, it has been found that one or both gaskets 15–16 continue to suffer thermal radiation damage.

Figure 2:
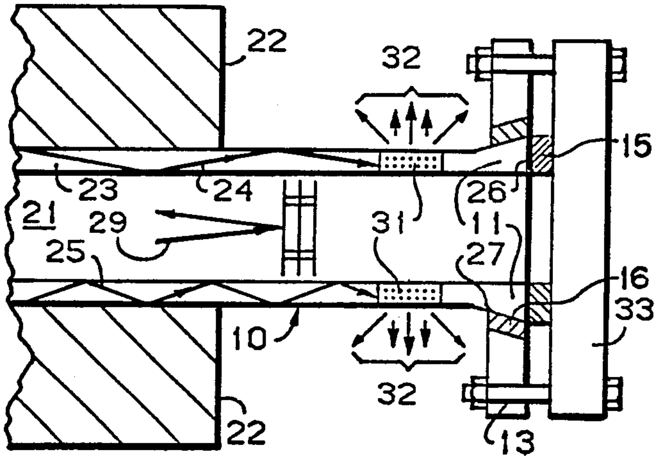
FIG. 2 illustrates a reaction tube similar to FIG. 1 but with the radiation scattering zone of the present invention installed between the hot zone and the closure flange.

FIG. 2 illustrates a tube similar to FIG. 1 but with radiation scattering zone 31 installed between hot zone 21 and flange 33 so that radiation rays 24–25 are intercepted and scattered in other directions as illustrated by rays 32, so as to significantly reduce the radiant energy reaching faces 26–27 of gaskets 15–16. The scattering zone is thus serially disposed in the radiation pathway or channel between the hot zone (radiation source) and the closure means so as to intercept and disperse radiant energy propagating in the channel. The method of forming scattering zone 31 will be explained subsequently.

Figure 3:
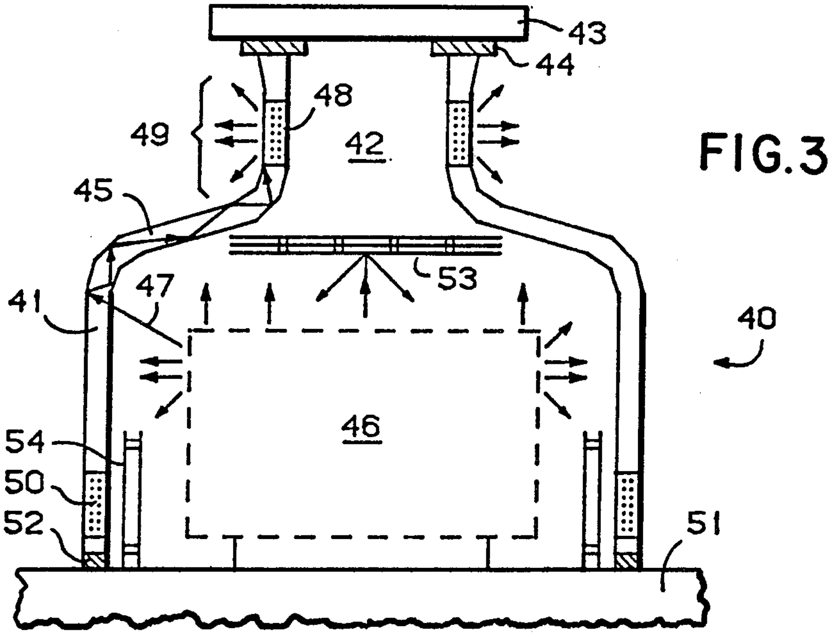
FIG. 3 illustrates a cross section of a bell jar reaction chamber utilizing the present invention to reduce the heat input to a closure flange.

FIG. 3 illustrates alternative embodiment 40 in which bell jar reaction chamber 41 has radiation baffles 53–54, neck region 42, and closure means 43 with gasket 44. Within chamber 41, hot zone 46 radiates thermal energy 47 into wall region 45 of bell jar 41. Thermal radiant energy 47 is intercepted by scattering zone 48 and dispersed as rays 49. Similarly scattering zone 50 can intercept and disperse radiant thermal energy being piped toward gasket 52 on base plate 51.

As an example of the use of the present invention, a substantially transparent vitreous quartz enclosure of the type illustrated in FIG. 3 but without radiation scattering region 46 was sealed with O-rings to flange 43. With a hot zone temperature of 1200° C., it was found that the O-rings reached temperatures of 300° C. This temperature of 300° C. is sufficient to cause the O-ring seals to stick to flange 43 and neck region 42 of the quartz vessel. It was frequently necessary to fracture the quartz vessel in order to remove the flange. This problem occurred even when forced convection or other cooling was provided for neck region 42 or flange 43. When the same structure was used under the same conditions but with thermal radiation scattering region 48 installed, the temperature of the O-rings remained below 200° C. No thermal damage or sticking was encountered, and no forced cooling was needed.

In the above experiment, neck region 42 was formed from a standard four inch (10 cm) interior diameter quartz pipe with a ⅜ inch (1 cm) wall thickness and ¾ inch (2 cm) end face contacting O-ring gasket 44. Flange 43 was metal. Thermal radiation scattering region 48 was varied in length from two to six inches (5–15 cm). While a two inch (5 cm) length of scattering region provided some improvement, greater blockage of piped thermal radiation was obtained using four to six inches (10-15 cm). Four inches (10 cm) was adequate to eliminate sticking even when placed directly in contact with gasket 44. The scattering region was formed of high purity crystalline quartz sand fused at a temperature sufficiently high to bond together the grains of the sand but not destroy their individual crystallinity. As a consequence, this material, while having substantially the same chemical and mechanical properties as clear fused quartz, has a milky appearance, is nearly opaque, and is an effective radiation scattering media. Because the coefficients of expansion are substantially the same as clear quartz, it can be readily sealed to quartz reaction vessels without encountering undersirable thermal stress problems. This milky form of quartz is a commercially available material well known in the art. An example is "opaque quartz" sold by the Thermal American Fused Quartz Company of Montville, New Jersey.

While a specific embodiment of the invention has been demonstrated using clear fused quartz as the reaction vessel material and milky fused quartz as the thermal radiation scattering region material, it will be readily apparent to those skilled in the art that the invented concept can be used with other material combinations, for example plastics, glass materials, oxides, nitrides or sulfides or combinations which are substantially transparent to thermal radiation in the wavelength region of interest for the particular source temperature being used. While it is desirable that the radiation scattering region be made of the same material as the reaction vessel but having scattering centers dispersed within so as to alter the optical properties while maintaining substantially the same mechanical and chemical properties, this is not essential and other material combinations will serve. It is desirable to minimize the mechanical stress which may result from differential thermal contraction of materials of different expansion coefficients.

Materials having desirable thermal radiation scattering properties may be formed by various sintering and melting procedures, as with the illustrated example of milky quartz, or by entrainment of air bubbles or foreign material, or by nuclear irradiation damage, or by other methods which produce a high density of localized radiation scattering sites.

The extent of the thermal radiation scattering region required to give effective dispersement of the thermal radiation being carried in the walls of the vessel or member is dependent upon the volume density of scattering sites and can be readily determined by experiment. The higher the volume density of scattering sites, the shorter may be the scattering region.

Thus, it is apparent that there has been provided in accordance with this invention an improved structure and method for protecting the closure or coupling means of a radiation carrying member from the radiant thermal energy being carried by the walls of that member from a hot zone. Further, it is apparent that there has been provided an apparatus and a method for the improved heating of materials, particularly semiconductor materials, to high temperatures in an enclosure while maintaining the end faces or other surfaces of that enclosure at a lower temperature than has previously been possible. It is further apparent that there has been provided in accordance with this invention a means for eliminating the forced cooling of couplings or end flanges on enclosure means of transparent reactor vessels capable of light pipe conduction of radiant energy.

Having thus described the invention, it will be apparent to those of skill in the art that various modifications can be made within the spirit and scope of the present invention. For example, this invention may be used to reduce thermal radiation being coupled into a low temperature cryostat along transparent members. Accordingly, it is intended to encompass all such modifications.

We claim:

1. In a process for heating material within an enclosure, a wall portion of which carries thermal radiation from a thermal radiation source region toward a closure means, the improvement comprising:

placing a thermal radiation scattering region in said wall portion between said source region and said closure means so as to intercept and disperse part of said radiation.

2. The process of claim 1 further comprising a process for heating a semiconductor material within said enclosure.

3. A method for protecting a closure means for a thermal radiation carrying member composed of a predetermined material, from radiation being carried by said member within said material from a portion of said member exposed to a thermal radiation source, comprising:

installing serially in said material of said member a thermal radiation scattering zone between said source and said closure means so as to reduce the thermal radiation reaching said closure means.

4. A process for manufacturing semiconductor devices, comprising:

providing a semiconductor material adapted to be processed by heating in an enclosure having a hot zone;

providing said enclosure for heating said semiconductor material in said hot zone, wherein said enclosure has a closure means, wherein said enclosure has a wall portion between said hot zone and said closure means which carries thermal radiation from said hot zone toward said closure means, and wherein said wall portion comprises a thermal radiation scattering region in said wall portion and between said hot zone and said closure means; and heating said semiconductor material in said hot zone.

5. The process of claim 4 wherein said second providing step comprises providing a quartz enclosure.

6. A process for manufacturing semiconductor material comprising:

providing an enclosure for heating said semiconductor material in a hot zone wherein said enclosure has a wall part which transmits thermal radiation;

providing an access port for said enclosure, coupled to said wall part;

providing between said hot zone and said access port a thermal radiation scattering means in said wall part to prevent a portion of said thermal radiation propagating in said wall part toward said access port from reaching said access port;

introducing into said enclosure a source material comprising said semiconductor material, and heating said source material in said enclosure to produce said semiconductor material.

* * * * *